US010889054B2

(12) United States Patent
Biesboer et al.

(10) Patent No.: US 10,889,054 B2
(45) Date of Patent: Jan. 12, 2021

(54) SACRIFICIAL PYROLYSIS METHOD FOR ADDITIVELY MANUFACTURED CERAMICS

(71) Applicant: HRL Laboratories, LLC, Malibu, CA (US)

(72) Inventors: Scott M. Biesboer, Santa Monica, CA (US); Jacob M. Hundley, Thousand Oaks, CA (US); Zak C. Eckel, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 370 days.

(21) Appl. No.: 15/823,336

(22) Filed: Nov. 27, 2017

(65) Prior Publication Data

US 2019/0160734 A1    May 30, 2019

(51) Int. Cl.
*B29C 64/135*   (2017.01)
*B29C 64/245*   (2017.01)
(Continued)

(52) U.S. Cl.
CPC .......... *B29C 64/135* (2017.08); *B29C 64/124* (2017.08); *B29C 64/245* (2017.08); *B33Y 10/00* (2014.12); *B33Y 30/00* (2014.12); *C08L 1/02* (2013.01); *C08L 23/06* (2013.01); *C08L 23/12* (2013.01); *C08L 33/08* (2013.01); *C08L 55/02* (2013.01); *C08L 67/04* (2013.01); *G03F 7/0037* (2013.01); *G03F 7/0384* (2013.01); *G03F 7/70416* (2013.01); *B29C 64/40* (2017.08);
(Continued)

(58) Field of Classification Search
CPC ........ B29C 64/135; B33Y 10/00; B33Y 30/00
See application file for complete search history.

(56) References Cited

U.S. PATENT DOCUMENTS

| 2004/0130032 A1* | 7/2004 | Gronbeck | ......... H01L 23/53295 |
| | | | 257/759 |
| 2005/0191913 A1* | 9/2005 | Farnworth | ............. B33Y 80/00 |
| | | | 439/862 |

(Continued)

OTHER PUBLICATIONS

By Kang & Cho (Development of an indirect stereolithography technology for scaffold fabrication with a wide range of biomaterial selectivity, Tissue Eng Part C Methods. Sep. 2012;18(9):719-29. doi: 10.1089/ten.TEC.2011.0621. Epub Apr. 27, 2012) (Year: 2012).*

(Continued)

*Primary Examiner* — Jacob T Minskey
*Assistant Examiner* — Melody Tsui
(74) *Attorney, Agent, or Firm* — Lewis Roca Rothgerber Christie, LLP

(57) ABSTRACT

A sacrificial substrate for use in stereolithography, having a first surface configured to be attached to a build platform, and a second surface of the sacrificial substrate configured to be attached to a photopolymer part. The sacrificial substrate physically separates the build platform and the photopolymer part, and serves as the deposition surface for the photopolymer part in place of the build platform. The sacrificial substrate may be separated from the build platform and then separated from the photopolymer part via pyrolysis, oxidation, or etching to thereby yield the free photopolymer part without subjecting the part to excess physical force or damage.

18 Claims, 9 Drawing Sheets

(51) Int. Cl.
  *G03F 7/20*   (2006.01)
  *G03F 7/038*  (2006.01)
  *C08L 1/02*   (2006.01)
  *C08L 23/06*  (2006.01)
  *C08L 33/08*  (2006.01)
  *C08L 55/02*  (2006.01)
  *C08L 67/04*  (2006.01)
  *B33Y 30/00*  (2015.01)
  *B33Y 10/00*  (2015.01)
  *C08L 23/12*  (2006.01)
  *G03F 7/00*   (2006.01)
  *B29C 64/124* (2017.01)
  *B29C 64/40*  (2017.01)

(52) U.S. Cl.
  CPC ... *C08L 2207/062* (2013.01); *C08L 2207/066* (2013.01)

(56) References Cited

U.S. PATENT DOCUMENTS

2006/0198918 A1* 9/2006 Koyagi ............ B33Y 10/00
                                              425/174.4
2011/0318528 A1* 12/2011 Cho ............... B29C 33/448
                                              428/131
2012/0328726 A1* 12/2012 Zenere ............ B29C 64/135
                                              425/174.4
2017/0291362 A1* 10/2017 Tombs ............. G03G 15/224

OTHER PUBLICATIONS

Park et al (Multiple fabrications of sacrificial layers to enhance the dimensional accuracy of microstructures in maskless projection microstereolithography, Int. J. Precis. Eng. Manuf. 10, 91-98 (2009), Jul. 15, 2009) (Year: 2009).*

* cited by examiner

SACRIFICIAL PYROLYSIS METHOD FOR ADDITIVELY MANUFACTURED CERAMICS

FIELD

The present disclosure relates generally to additive manufacturing, and more specifically to a build substrate and a device for additive manufacturing that are compatible with polymers of high inorganic content.

BACKGROUND

Additive manufacturing (AM) using stereolithography or three-dimensional (3D) printing of photopolymer resins is of widespread interest as a method of producing structures or parts with complex geometries. These methods typically form a structure by sequentially depositing multiple layers or cross-sections of material in a horizontal stack until a desired height or form is achieved.

In stereolithography, layers of solid material are typically formed by exposing layers of a liquid photopolymer resin to a radiation source, thereby curing or polymerizing the liquid photopolymer resin. The liquid photopolymer resin is held in a reservoir, and the layers of solid cured resin are deposited directly on a build platform configured to move in and out of the reservoir.

The solid cured resin is attached or adhered to the build platform so that the build platform and cured resin can be repositioned as a single piece in or above the reservoir. During formation of the cured resin part, it is typically desirable that this adhesion be strong enough to avoid unwanted delamination or detachment of the part. However, strong adhesion between the part and the build platform may also result in damage to the part when it is removed from the build platform. Parts formed of brittle materials, such as those formed using high inorganic content preceramic photopolymer resins, are particularly susceptible to damage upon attempted removal from the build platform. Accordingly, additive manufacturing using brittle materials has been limited.

SUMMARY

Aspects of embodiments of the present disclosure are directed toward a sacrificial substrate for use in stereolithography, a stereolithography device including the sacrificial substrate, and a method of producing a part using the stereolithography device including the sacrificial substrate.

Additional aspects will be set forth in part in the description which follows, and, in part, will be apparent from the description, or may be learned by practice of the presented embodiments.

According to embodiments of the present disclosure, a sacrificial substrate includes a sacrificial substrate polymer. A first side of the sacrificial substrate is configured to be attached to a build platform, and a second side of the sacrificial substrate is configured to be attached to a photopolymer part.

The sacrificial substrate polymer may include an acrylate, methacrylate, epoxy, thiol, or urethane photopolymer, or a mixture thereof; and the sacrificial substrate polymer may be formed directly on the build platform.

The build platform may include a texturizing feature; and a portion of the sacrificial substrate polymer may be formed inside the texturizing feature.

The sacrificial substrate polymer may include a first functional group; the photopolymer part may include a second functional group; and the first functional group and the second functional group may form a bond.

In some embodiments, the first functional group and the second functional group may be acrylates. In some embodiments, the first functional group and the second functional group may be thiols.

The sacrificial substrate polymer may include polylactic acid (PLA), polyethylene terephthalate (PET), biaxially oriented polyethylene terephthalate (BOPET), cellulose, polypropylene, high density or low density polyethylene (HDPE, LDPE), acrylonitrile butadiene styrene (ABS), or a mixture thereof.

The sacrificial substrate may include a texturizing feature on the second side of the sacrificial substrate to increase mechanical adhesion to the photopolymer part.

In some embodiments, the first side of the sacrificial substrate may be attached to the build platform by an adhesive.

In some embodiments, the first side of the sacrificial substrate may be attached to the build platform by a hook and loop attachment. In some embodiments, the first side of the sacrificial substrate may be attached to the build platform by a reversible mechanical fastener. In some embodiments, the first side of the sacrificial substrate may be attached to the build platform by a magnetic force. In some embodiments, the first side of the sacrificial substrate may be attached to the build platform by a pressure differential.

According to embodiments of the present disclosure, a stereolithography device includes: a reservoir for holding a photopolymer resin, a build platform configured to move vertically with respect to the reservoir, a light source, and a sacrificial substrate attached to the build platform and positioned between the build platform and the light source.

According to embodiments of the present disclosure, a method of additively manufacturing a photopolymer part includes: attaching a sacrificial substrate to a build platform; forming the photopolymer part on the sacrificial substrate; separating the sacrificial substrate from the build platform; and removing the sacrificial substrate from the photopolymer part.

The attaching of the sacrificial substrate to the build platform may include polymerizing a photopolymer resin directly on the build platform.

The separating of the sacrificial substrate from the build platform and/or the removing of the sacrificial substrate from the photopolymer part may include etching or dissolving the sacrificial substrate.

The removing of the sacrificial substrate from the photopolymer part may include heating the sacrificial substrate and photopolymer part to a temperature sufficient to selectively melt, pyrolyze, sublimate, or oxidize the sacrificial substrate.

The heating of the sacrificial substrate and photopolymer part may include heating to a temperature of about 200° C. to about 1000° C.

The photopolymer part may include a preceramic polymer or a ceramic formed from the preceramic polymer.

BRIEF DESCRIPTION OF THE DRAWINGS

These and other features and advantages of embodiments of the present disclosure will become more apparent by reference to the following detailed description when considered in conjunction with the following drawings, in which.

DETAILED DESCRIPTION

Figure 1A:
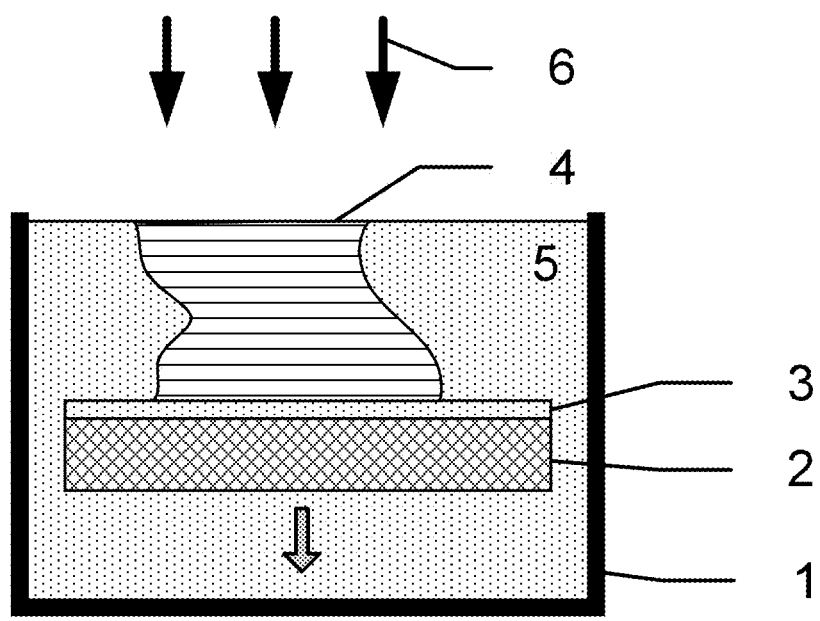
FIG. 1A is a schematic diagram showing an cross-sectional schematic view of the build area of a top-down stereolithography system according to embodiments of the present disclosure.

In the following detailed description, only certain example embodiments of the subject matter of the present disclosure are shown and described, by way of illustration. As those skilled in the art would recognize, the subject matter of the present disclosure may be embodied in many different forms and should not be construed as being limited to the embodiments set forth herein.

In the context of the present application, when a first element is referred to as being "on", "overlapping", "coupled to", or "connected to" a second element, it can be directly on, directly overlapping, directly coupled to, or directly connected to the second element, or be indirectly on, indirectly overlapping, indirectly coupled to, or indirectly connected to the second element with one or more intervening elements interposed therebetween. Like reference numerals designate like elements throughout the specification. The thicknesses of layers, films, panels, regions, etc., may be exaggerated in the drawings for clarity. The drawings are not necessarily drawn to scale.

Aspects of embodiments of the present disclosure are directed toward a sacrificial substrate for use in stereolithography, a stereolithography device including the sacrificial substrate, and a method of manufacturing a photopolymer part using the stereolithography device including the sacrificial substrate.

Stereolithography is an additive manufacturing technique in which parts are manufactured via layer by layer deposition of a material on a build platform. In stereolithography, the material to be deposited is typically provided as a reservoir of liquid photopolymer resin. Thin layers of the liquid photopolymer resin may be polymerized (e.g., cured) and deposited on the build platform when the liquid resin is exposed to radiation (e.g., light) having a suitable wavelength, for example, UV light. Stereolithography systems can be classified as top-down or bottom-up systems, depending on whether the radiation is applied from above or below the reservoir, respectively.

As used herein, the term "photopolymer resin" may refer to: 1) a liquid solution or mixture including one or more monomers, oligomers, and/or crosslinkers that may be polymerized or "cured" to form a solid polymer network upon exposure to light radiation of a suitable wavelength (e.g., UV light); and/or 2) a solid or semi-solid product formed upon polymerization or partial polymerization of the liquid solution or mixture including one or more monomers, oligomers, and/or crosslinkers. In the context of additive manufacturing via stereolithography and/or 3D printing, the liquid, uncured "photopolymer resin" may also be referred to as a "photopolymer ink". Terms such as "cured resin", "cured photopolymer", etc. may be interchangeably used herein to refer to the solid or semi-solid polymer or printed structure produced upon curing of the photopolymer resin or ink, and to thus distinguish the solid, cured or partially cured polymer/structure from the liquid, uncured photopolymer resin or ink. However, it will be understood that references to the photopolymer resin, cured resin, or simply the/a "resin" may encompass one or both of the cured and uncured states, and those of ordinary skill in the art are capable of determining the relevant state(s) of the material based on context. Further, the terms "part" or "photopolymer part" may be used herein to refer to a solid or semi-solid polymer structure to be used as a final product or as a precursor to the final product.

In a top-down stereolithography approach, a liquid photopolymer resin held in a reservoir is exposed to a radiation source through the open top of the reservoir. The part to be additively manufactured is formed on the top surface of a build platform submerged within the reservoir (e.g., on the side of the build platform that faces the open top of the reservoir). Prior to each exposure, the build platform and/or partially formed part is positioned below the surface of the liquid photopolymer resin at a distance corresponding to the desired thickness of the next deposited layer. During exposure to the radiation source, the layer of liquid photopolymer resin between the top surface of the liquid in the reservoir and the upper surface of the submerged platform or part is cured, thus forming a new solid layer. The build platform and partially formed part are then moved further downward into the reservoir so that additional layers can be deposited on the newly formed top surface of the part.

In a bottom-up stereolithography approach, the liquid photopolymer resin is exposed to a radiation source through a radiation-transparent aperture at the bottom of the reservoir. The part to be additively manufactured is formed on the bottom of a build platform submerged within the reservoir (e.g., on the side of the build platform that faces the bottom of the reservoir). Prior to each exposure, the build platform and/or partially formed part is positioned at a distance from the aperture corresponding to the desired thickness of the next deposited layer. During exposure to the radiation source, the layer of liquid photopolymer resin between the aperture and the bottom surface of the platform or part is cured, thus forming a new solid layer. The new layer of solid resin is then separated or peeled away from the aperture so that the build platform and/or part can be repositioned upward and additional layers can be deposited on the newly formed bottom surface of the part. As used herein, the terms "radiation-transparent" or "transparent" refer to an ability to transmit radiation (e.g., light) without detrimental amounts of absorption or scattering, and in this context may specifically refer to transmission of light having a suitable wavelength for curing the photopolymer resin. For example, the radiation-transparent aperture may be transparent to light having a wavelength in the ultraviolet (UV) range, e.g., between about 200 nm to about 460 nm. However, embodiments of the present disclosure are not limited thereto, and it will be understood that those of ordinary skill in the art should be able to select other suitable radiation sources, wavelengths, and transparency characteristics according to the principles described herein. As used herein, the term "aperture" refers to a group of one or more parts positioned between the photopolymer resin and the exposure source that facilitates transmission of the radiation used for curing into the photopolymer resin.

In either approach, the solid cured resin is attached or adhered to one side of the build platform so that the build platform and partially or fully formed part can be repositioned as a single piece in or above the reservoir, as described above. During formation of the part, it is typically desirable that this adhesion between the build platform and part be secure and strong enough to avoid unwanted delamination or detachment of the part from the build platform, for example, during repositioning of the build platform, when stress or strain is applied to the part during manufacturing (e.g., due to a force such as gravity), or when a part is repeatedly separated from the aperture in a bottom-up stereolithography device.

In addition, when the adhesion between the part and the build platform is suitably secure and/or strong, new resin layers may be deposited while the underlying layers are only partially cured (e.g., not fully solidified, cross-linked, or polymerized). This may reduce the required time delay between deposition of successive layers, as well as the overall time required for manufacturing the part. Furthermore, scattering of the incident radiation by the cured resin, which can decrease or limit the resolution of the cured part, may be decreased when the resin is only partially cured. As such, secure attachment between the part and the build platform during deposition of the part may be desirable.

However, strong adhesion between the part and the build platform may also result in damage to the part when it is separated from the build platform. For example, when the part includes one or more weak points (e.g., a portion having a limited cross-sectional area such as a thin column, tapered portion, or bottleneck), applying mechanical stress or force to the part may result in cohesive damage (e.g., to the body of the part) rather than removal of the part, as a single piece, from the platform.

In addition, when the part is made of a brittle material, it may be damaged upon attempted removal from the build platform. Because most photopolymer plastics (e.g., acrylates, urethanes, and epoxies) are inherently ductile and tough, mechanical methods of removal such as scraping (e.g., with a scraping tool or spatula) or trimming (e.g., with a thin knife or blade) can be used to separate such photopolymer parts from the build platform. In contrast, newer photopolymer materials having low molecular weights and high inorganic content constituents, such as those used to manufacture preceramic materials, are relatively brittle and highly susceptible to damage. As such, the use of these new photopolymer materials in stereolithography has been limited. Therefore, strategies for controlling the adhesion or attachment of the part to the build platform, reducing the amount of force that must be applied to the part during removal, and/or circumventing the need to expose the part to mechanical stress during removal may allow a greater range of materials and structures to be processed using additive manufacturing.

As used herein, the term "preceramic" refers to a material that can be heated, pyrolyzed, and/or oxidized at an elevated temperature (e.g., above 200° C., for example about 200° C. to about 1,000° C.) to thereby produce a ceramic material. As used herein, the term "ceramic" refers to an inorganic (e.g., non-organic) and non-metallic solid comprising a network of metal, non-metal, and/or metalloid atoms held together via ionic and/or covalent bonds. Ceramic materials may be crystalline, semi-crystalline, or amorphous. Non-limiting examples of ceramic materials may include metal oxides, boride, carbides, and nitrides, such as silicon carbide, silicon nitride, zirconium oxide, and the like. As used herein to describe a photopolymer resin, the term "high inorganic content" refers to a preceramic material including inorganic atoms, which may be retained upon conversion of the preceramic material to a ceramic material. In some embodiments, the inorganic content may include silicon (Si) atoms, for example, when the preceramic photopolymer resin or one of its components is based on a derivative of siloxane, silazane, carbosilane, etc., and/or when the preceramic is used to produce a ceramic material such as silicon carbide (SiC), silicon carbonitride (SiCN), silicon oxycarbide (SiOC), silicon oxycarbonitride (SiOCN), silicon carboboride (SiCB), etc. However, embodiments of the present disclosure are not limited thereto, and other suitable photopolymer resin compositions, e.g., compositions including other inorganic atoms in addition to or in place of Si, are expressly included within the scope of the present disclosure. In some embodiments, the inorganic content may be present as a major component or as a primary component. As used herein, the term "major component" refers to a component that is present in a composition, polymer, or product in an amount greater than an amount of any other single component in the composition or product. In contrast, the term "primary component" refers to a component that makes up at least 50% (wt % or atom %) or more of the composition, polymer, or product. However, it will be understood that the inorganic component may be included in any amount; for example, as a minor component (e.g., in an amount less than that of other materials included in the component), and the practical definition of "high" refers to any amount or proportion of inorganic material that causes the photopolymer resin or cured resin to detrimentally adhere to a compliant release layer including silicone-based or fluorinated materials, as described herein.

According to embodiments of the present disclosure, a sacrificial substrate for use in stereolithography includes a sacrificial substrate polymer. A first surface of the sacrificial substrate is configured to be attached to a build platform, and a second surface of the sacrificial substrate is configured to be attached to a photopolymer part, according to embodiments of the present disclosure as described herein. Accordingly, the sacrificial substrate physically separates the build platform and the photopolymer part, and serves as the deposition surface for the photopolymer part in place of the build platform.

In some embodiments, the sacrificial substrate may be formed (e.g., polymerized) directly on the build platform, such that the sacrificial substrate is attached to the build platform during the process of formation. The sacrificial substrate polymer included in the sacrificial substrate may be any polymer capable of being deposited and polymerized in situ, and those of ordinary skill in the art should be capable of selecting a polymer composition/chemistry, application method, and/or curing method according to the principles described herein. For example, the sacrificial substrate polymer may be applied to the build platform as a mixture, solution, paste, suspension, etc. including one or more monomers, oligomers, and/or cross-linkers, and may form a polymer network upon evaporation of a solvent and/or upon addition of energy in the form of heat, UV light, etc.

In some embodiments, the sacrificial substrate may be provided as a pre-formed material that is subsequently attached or joined to the build platform. In some embodiments, the pre-formed material may be the same as those described herein in connection with the directly deposited sacrificial substrate.

In some embodiments, the sacrificial substrate polymer may be a photopolymer, and specifically, a photopolymer that may be deposited using stereolithography. In some embodiments, the photopolymer included in the sacrificial substrate may be deposited using the same stereolithography device that is used to deposit the photopolymer part.

The sacrificial substrate polymer (e.g., photopolymer) included in the sacrificial substrate may be any suitable polymer, as described herein, as long as it is different from the polymer used to subsequently form the photopolymer part. As used in this context, the term "different" may refer to polymers having compositional, chemical, and/or material characteristics that are sufficiently dissimilar so that the two polymers (and thereby the sacrificial substrate and the part made of the two polymers) can be separated by taking advantage of their dissimilar properties. For example, the polymers may be physically or chemically separable based on their distinct melting points, glass transition temperatures, autoignition temperatures, solubilities, reactivities to acid or base, differentiating products, etc.

In some embodiments, for example, the photopolymer part may include a polymer having a high inorganic content, such that the photopolymer part is a preceramic that is converted to a ceramic material upon heating to a temperature of about 200° C. to about 1,000° C. The conversion from preceramic to ceramic material may be accompanied by a loss of mass (e.g., mass loss) corresponding to conversion of organic residues within the preceramic polymer to gaseous products that are subsequently lost to the atmosphere. The covalently and ionically bonded matrix of remaining atoms and residues becomes the ceramic material, which may have the same general volume and form as the preceramic precursor. Meanwhile, the sacrificial substrate attached to the cured photopolymer part may include an organic (e.g., carbon-based) sacrificial substrate polymer that is oxidized or decomposed at that same temperature to gas and/or particles that can be easily separated from the cured photopolymer part. Non-limiting examples of such gas and particulate decomposition products may include $CO$, $CO_2$, acetaldehyde, ethylene, benzene, water vapor, carbon ash, and soot. In some embodiments, the organic polymer may be decomposed to a gas, the gas including $CO$, $CO_2$, acetaldehyde, ethylene, water vapor, or a mixture thereof.

In some embodiments, the sacrificial substrate polymer may be selected for its temperature-dependent oxidation (combustion) and/or pyrolytic behavior. For example, the sacrificial substrate polymer may have a temperature of decomposition, combustion, or pyrolysis lower than that of the cured photopolymer part, such that the photopolymer part and the sacrificial substrate can be heated to a temperature at which the photopolymer part remains intact and the sacrificial substrate is converted into one or more decomposition products, as described herein. The difference in decomposition temperatures may be any difference that can be stably maintained by a furnace or heater used to carry out the separation. For example, the decomposition temperature of the sacrificial substrate may be at least about 100° C., at least about 50° C., or at least about 30° C. lower than the decomposition temperature of the cured photopolymer part.

In some embodiments, the sacrificial substrate polymer may have a temperature of decomposition, combustion, or pyrolysis lower than the temperature of ceramic conversion of the photopolymer part, such that the photopolymer part and the sacrificial substrate can be heated to a temperature at which the sacrificial substrate decomposes and mass loss does not occur in the preceramic photopolymer part, after which the temperature can be raised so that the remaining preceramic photopolymer part can be converted into a ceramic part. The difference in temperatures may be the same as described above. For example, the decomposition temperature of the sacrificial substrate may be at least about 100° C., at least about 50° C., or at least about 30° C. lower than the conversion temperature of the preceramic cured photopolymer part.

In some embodiments, the sacrificial substrate polymer may be selected for its temperature-dependent phase characteristics. For example, the sacrificial substrate polymer may have a melting or sublimation point lower than the preceramic conversion temperature of the cured photopolymer part, such that the photopolymer part and the sacrificial substrate can be heated to a temperature at which the photopolymer part remains intact and the sacrificial substrate is melted or sublimed, and can be drained away from the photopolymer part. The difference between the melting or sublimation point of the sacrificial substrate and the lowest conversion or reaction temperature of the cured photopolymer part may be any difference that can be stably maintained by a furnace or heater used to carry out the separation. For example, the melting or sublimation temperature of the sacrificial substrate may be at least about 100° C., at least about 50° C., or at least about 30° C. lower than the lowest conversion or reaction temperature of the cured photopolymer part. As used in this context, the term "lowest reaction temperature" refers to the lowest temperature at which a chemical reaction (e.g., pyrolysis or oxidation) is initiated.

In some embodiments, the sacrificial substrate polymer may include one or more bulky alkyl or aryl groups to prevent or reduce orderly packing of the polymer. The increased disorder may cause a decrease in the solid state crystallinity, and thereby the $T_g$ and/or melting point of the polymer. As used herein, the term "bulky" is used in its art-recognized sense to refer to a substituent that has a large molecular volume relative to a hydrogen atom (substituent), and in some embodiments relative to a methyl group. Non-limiting examples of bulky alkyl and aryl groups may include a propyl group, a butyl group, a pentyl group, a hexyl group, a heptyl group, an octyl group, a nonyl group, a decanyl group, a substituted or unsubstituted phenyl group, a substituted or unsubstituted benzyl group, a substituted or unsubstituted biphenyl group, etc., and mixtures thereof. The degree of substitution with the bulky groups (e.g., number of substitutions per formula unit) is not particularly limited, and those of ordinary skill in the art should be capable of selecting appropriate groups and degrees of substitution thereof according to the desired characteristics of the polymer.

In some embodiments, the sacrificial substrate polymer may have a chemical composition or structure that encourages adhesion between the sacrificial substrate and the cured photopolymer part. In some embodiments, for example, the sacrificial substrate polymer and the polymer included in the photopolymer part may include complementary first and second functional groups. As used herein, the term "complementary" may refer to an ability to form a stabilizing bond. For example, the stabilizing bond may be a covalent bond, an ionic bond or electrostatic attraction, or a weak bonding interaction, such as a hydrogen bond, a Van der Waals (London dispersion force) interaction, a pi-stacking interaction, a dipole-dipole interaction, etc., or a combination thereof.

The first and second functional groups may be the same group, or may be different groups. Non-limiting examples of suitable functional groups may include an alkyl group, a methyl group, an alkenyl group, a vinyl group, an alkyne group, a hydride group, an aryl group, a phenyl group, a hydroxy group, a silanol group, an alkoxy group, an amine group, a carboxylate group, an amide group, an imine group, a nitrile group, an epoxy group, an acrylate (methacrylate) group, a thiol group, an acetoxy group, a chloride group, an isocyanate group, an azide group, an ammonium group, a sulfide group, a borate group, a nitrate group, a sulfate group, a phosphate group, and combinations thereof. In some embodiments, the functional groups may include an acrylate (methacrylate) group, a thiol group, a vinyl group, an epoxy group, an azide group, an isocyanate group, a nitrile group, or a combination thereof.

The concentration or degree of substitution of the polymer with the functional groups (e.g., number of substitutions per formula unit) is not particularly limited, and those of ordinary skill in the art should be capable of selecting appropriate groups and degrees of substitution thereof according to the desired characteristics and reactivity of the polymer.

In some embodiments, a first functional group included in the sacrificial substrate polymer may form an ionic bond or electrostatic attraction with a second functional group included in the photopolymer part. For example, the first functional group may be a cationic group and second functional group may be an anionic group, or vice versa. Non-limiting examples of a cationic group may include an ammonium (e.g., quaternary ammonium) group and a phosphonium group. Non-limiting examples of an anionic group may include a hydroxide group, a sulfide group, a borate group, a nitrate group, a sulfate group, a phosphate group, and a carboxylate group.

In some embodiments, a first functional group included in the sacrificial substrate polymer may form a hydrogen bond with a second functional group included in the photopolymer part. The first and second functional groups may include any combination of groups capable of forming a hydrogen bond, e.g., groups in which an electronegative atom such as oxygen, nitrogen, or fluorine is able to interact with an electropositive hydrogen atom. Non-limiting examples of such functional groups may include a hydroxyl group, an amine group, a carbonyl group, an amide group, a carboxylic acid group, a silanol group, a fluorine atom, and mixtures thereof.

In some embodiments, a first functional group included in the sacrificial substrate polymer may participate in a pi-stacking interaction with a second functional group included in the photopolymer part. The first and second functional groups may include any combination of $C_5$-$C_{30}$ aromatic (e.g., aryl) or heteroaromatic (e.g., heteroaryl) ring groups. Non-limiting examples of such groups may include a phenyl group, a naphthyl group, an anthracenyl group, a phenanthrenyl group, a pyrenyl group, a chrysenyl group, a pyridinyl group, a pyrimidinyl group, a pyrazinyl group, a triazinyl group, a quinolinyl group, an isoquinolinyl group, a furanyl group, a benzofuranyl group, a benzothiophenyl group, a carbazolyl group, and mixtures thereof.

In some embodiments, a first functional group included in the sacrificial substrate polymer may form a covalent bond (e.g., linkage) with a second functional group included in the photopolymer part. Non-limiting examples of first and second functional group combinations for forming a covalent bond include a vinyl group and a methyl group (e.g., for peroxide induced free radical coupling), a vinyl group and a hydride group (e.g., for hydrosilylation and/or vinyl addition), a hydride group and a silanol group (e.g., for dehydrogenative coupling), a silanol group and an acetoxy, alkoxy, ester, enoxy, oxime, and/or amine group (e.g., for condensation curing), a hydride group and a silanol group (e.g., for dehydrogenative coupling), an amine group and an epoxy group (e.g., for epoxy addition), a hydroxyl group and an ester, epoxy, isocyanate, or phenol group (e.g., for polyester, polyurethane, or polyphenol synthesis), two methacrylate or acrylate groups (e.g., for radical induced polymerization), two thiol groups (e.g., for S—S dimerization), and combinations thereof. However, embodiments of the present disclosure are not limited thereto, and those of ordinary skill in the art should be capable of selecting suitable polymers and functional groups according to the desired bond forming reaction and the principles described herein. The bond forming reactions may also be described as polymerization reactions.

In some embodiments, the covalent bond may be formed via a photoactivated bond forming or polymerization reaction. For example, when the functional groups include an acrylate group, a methacrylate group, a thiol group, a vinyl group, an epoxy group, or a combination thereof, the reaction may be photoinitiated by light having a suitable wavelength (for example, UV light or light having a wavelength of about 200 nm to about 460 nm). The light may be generated by any suitable exposure source, such as a digital projector, a lamp, a diode, an LED, a laser, etc. The light may be in any suitable form, and for example, may be collimated (coherent) or non-coherent. In some embodiments, the light used to form the covalent bond between the first and second functional groups may be the same light used to cure the photopolymer resin during deposition of the photopolymer part. However, embodiments of the present disclosure are not limited thereto, and those of ordinary skill in the art should be capable of selecting an appropriate light and exposure source based on the principles described herein.

In some embodiments, the covalent bond may be formed via a [2+4] cycloaddition reaction. As used herein, the terminology "[2+4]" is used in its art-recognized sense to refer to a reaction involving 2 electrons from a first reactant (e.g., a group containing an unsaturated double or triple bond, such as an alkyne) and 4 electrons from a second reactant (e.g., a group containing two unsaturated double bonds, such as an azide group). Such reactions may also be characterized as or described by the terms "click reaction" or "1,3-dipolar cycloaddition", wherein the azide may be described as a 1,3-dipole and the unsaturated bond may be described as a dipolarophile. However, it is to be understood that such named reactions and their proposed or commonly accepted mechanisms are referenced solely for the purpose of illustrating the embodiments of the present disclosure, and are not intended to be limiting. When the covalent bond is formed via a [2+4] cycloaddition or click reaction, the first and second functional groups may include an azide group, an alkyne group, an alkene group (e.g., a vinyl group), a carbonyl group, an imine group, an isocyanate group, a nitrile group, and suitable combinations thereof.

In some embodiments, the functional groups and reactions that enable bond formation between the sacrificial substrate and the photopolymer part may be the same functional groups and reactions that enable polymerization within (e.g., curing of) the sacrificial substrate and/or the photopolymer part.

In some embodiments, a portion of the sacrificial substrate that is adjacent to the interface with the photopolymer part may be partially cured (e.g., may not be fully cured) at the time that deposition of the photopolymer part is initiated. As used herein, the term "partially cured" refers to a state in which less than 100% of the functional groups in the material have reacted. For example, the polymer may be in a state in which less than about 90% of the functional groups have reacted (e.g., about 10% are still available to form new bonds), and in some embodiments, less than about 80% of the functional groups have reacted (e.g., about 20% are still available to form new bonds), less than about 70% of the functional groups have reacted (e.g., about 30% are still available to form new bonds), or less than about 60% of the functional groups have reacted (e.g., about 40% are still available to form new bonds). When adjacent layers of the sacrificial substrate and the photopolymer part both include "dangling ends", or unreacted functional groups, the unreacted functional groups in each layer may react or couple with each other across the layers to thereby form interlayer bonds, thus improving the strength of adhesion between the sacrificial substrate and the photopolymer part.

In some embodiments, the sacrificial substrate polymer may include polylactic acid (PLA), polyethylene terephthalate (PET), biaxially oriented polyethylene terephthalate (BOPET), cellulose, polypropylene, high density or low density polyethylene (HDPE, LDPE), acrylonitrile butadiene styrene (ABS), or mixtures thereof. For example, the sacrificial substrate polymer may include any commercially available polymer for stereolithography as long as it is compatible with the photopolymer part, as described herein.

In some embodiments, the sacrificial substrate polymer may include a derivative of polylactic acid (PLA), polyethylene terephthalate (PET), biaxially oriented polyethylene terephthalate (BOPET), cellulose, polypropylene, high density or low density polyethylene (HDPE, LDPE), acrylonitrile butadiene styrene (ABS), or mixtures thereof. As used herein, the term "derivative" may refer to a polymer differing from the base polymer by the addition (e.g., modification or substitution) of one or more functional groups. The derivative polymer may include one or more suitable functional groups as described herein.

The sacrificial substrate polymer may be a single polymer or a mixture of polymers. The amounts (e.g., concentrations) of each polymer are not particularly limited. For example, when a polymer including an adhesion-promoting functional group as described herein is included in the sacrificial substrate polymer, the adhesion-promoting functional group polymer may be included in any amount between 1 wt % to 100 wt % of the total polymer mixture that is sufficient to impart or measurably enhance adhesion between the sacrificial substrate and the photopolymer part, and those of ordinary skill in the art should be capable of selecting appropriate amounts based on the mixture of polymers, functional groups, and concentrations thereof.

In some embodiments, the sacrificial substrate may have a thickness of about 0.001" to about 1.0". For example, the sacrificial substrate may have a thickness of about 0.01" to about 0.5", or about 0.1" to about 0.25".

The sacrificial substrate may have any suitable shape and volume. In some embodiments, the surface facing the light source may be oriented generally parallel to the light source and/or reservoir in order to promote even deposition of photopolymer layers, particularly in bottom-up stereolithography. As used herein, the term "generally parallel" refers to the orientation of an imaginary plane that is tangent to the outside surface of the sacrificial substrate closest to the light source and selected to have a maximum shared surface area with that surface. The imaginary plane does not necessarily preclude the existence of non-parallel secondary structures or texturing within the surface, as will be described herein. When the surface of the imaginary plane is oriented in this manner, warping and distortion of the surface of the cured photopolymer part may be minimized or reduced.

The sacrificial substrate is not constrained to be the same size or shape (e.g., have the same area) as the build platform or the cured photopolymer part. In some embodiments, for example, the sacrificial substrate may have a smaller size that the build platform (e.g., may cover only a portion of the build platform). In some embodiments, the cured photopolymer part may have a smaller size that the sacrificial substrate (e.g., may cover only a portion of the sacrificial substrate). In both cases, the area of coverage may be fully contiguous, or may include two or more non-contiguous regions.

The average deposition density of the sacrificial substrate may be the same as the average density of the cured photopolymer part, or may be lower. As used in this context, the term "density" may refer to the number of deposited polymer molecules per unit area, or the mass of deposited polymer molecules per unit area. In some embodiments, for example, the average density of the sacrificial substrate relative to the average density of the cured photopolymer part may be about 0.5 to about 1.0, or about 0.6 to 0.8.

The first side of the sacrificial substrate may be attached to the build platform using any suitable method, examples of which are described herein. It will be understood that those of ordinary skill in the art should be capable of selecting and implementing a method of attachment according to the example embodiments and principles described herein.

FIG. 1A is a schematic diagram showing an cross-sectional schematic view of the build area of a top-down stereolithography system including a sacrificial substrate according to embodiments of the present disclosure. A reservoir 1 for holding a photopolymer resin 5 is positioned at the bottom of the build area. The reservoir 1 has an open top that allows for a build platform 2 to be positioned within the reservoir 1. The build platform 2 is capable of being moved or translated in the vertical direction (e.g., into or out of the reservoir 1), and is translated downward (e.g., further into the reservoir 1) as deposition progresses (single gray arrow). An optional sacrificial substrate 3 is positioned on the upper side of the build platform 2, facing the open top of the reservoir 1. During deposition, a photopolymer part 4 is deposited on the upper side of the sacrificial substrate 3 by exposing the photopolymer resin 5 contained in the reservoir 1 to a light source 6 positioned above the open top of the reservoir.

Figure 1B:
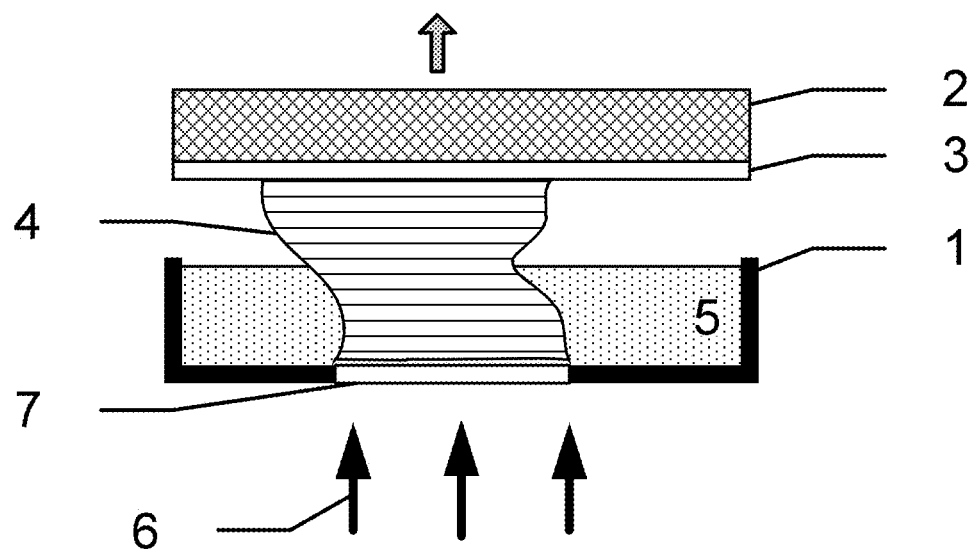
FIG. 1B is a schematic diagram showing a cross-sectional schematic view of a bottom-up stereolithography system according to embodiments of the present disclosure.

FIG. 1B is a schematic diagram showing a cross-sectional schematic view of a bottom-up stereolithography system including a sacrificial substrate according to embodiments of the present disclosure. As in the top-down system, the reservoir 1 for holding the photopolymer resin 5 is positioned at the bottom of the build area. The reservoir 1 has an open top, and the build platform 2 is positioned above the open top of the reservoir 1. The build platform 2 is capable of being moved or translated in the vertical direction (e.g., toward or away from the reservoir 1), and is translated upward (e.g., away from the reservoir 1) as deposition progresses (single gray arrow). An optional sacrificial substrate 3 is positioned between the build platform 2 and the bottom floor of the reservoir 1. During deposition, a photopolymer part 4 is deposited on the lower side of the sacrificial substrate 3 (e.g., between the sacrificial substrate 3 and the reservoir 1) by exposing a photopolymer resin 5 contained in the reservoir 1 to a light source 6. The light source 6 is positioned below a transparent aperture 7 embedded in the bottom floor of the reservoir.

In some embodiments, as described herein, the sacrificial substrate may be formed (e.g., polymerized) directly on the build platform. Accordingly, the sacrificial substrate may be adhered to the build platform as the polymer included in the sacrificial substrate hardens.

Figure 2A:
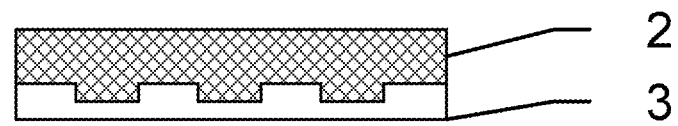
FIG. 2A is a schematic cross-sectional view of a sacrificial substrate directly polymerized on a build platform, according to embodiments of the present disclosure.

In some embodiments, when the sacrificial substrate is formed by polymerizing directly on the build platform, the build platform may be texturized or roughened to increase its surface area. As a result, when the sacrificial substrate polymer is deposited on the build platform, portions of the sacrificial substrate polymer may be deposited within the textured regions or features, thus forming a complementary interface having a high surface area. FIG. 2A is a schematic cross-sectional view of an example embodiment in which a texturized sacrificial substrate 3 is polymerized directly on the build platform 2 to complement its texturized surface. It will be understood that in FIG. 2A and the following drawings (e.g., FIGS. 2A-2E), the orientation of the build platform 2 and sacrificial substrate 3 is arbitrarily depicted with respect to gravity, and the embodiments described therein may be suitably applied to any top-down or bottom-up stereolithography system unless explicitly stated otherwise.

In some embodiments, the adhesion between the sacrificial substrate and the build platform may be increased due to the formation of an interlocking structure. As used in this context, the term "interlocking" refers to a structure in which each protrusion of a surface is closely fitted into a hole of complementary size and shape in the adjoining surface, analogous to the relationship between adjacent pieces of a jigsaw puzzle. In some embodiments, the adhesion between the sacrificial substrate and the build platform may be increased due to the presence of texturizing features. The texturizing features may increase the total surface area of the interface between the sacrificial substrate and the build platform, thereby increasing the number of weak bonding (e.g., Van der Waals) interactions between the two surfaces. Non-limiting examples of such interlock or texturizing features include grooves or trenches, waffle plate patterns, pores or protrusions, etc., and mixtures thereof. The texturizing features may be evenly and periodically distributed or may be unevenly and/or randomly distributed.

In some embodiments, when the texturizing features include grooves or trenches, the depth and width of the grooves or trenches may each independently be about 50 μm to about 10 mm, or about 100 μm to about 5 mm, or about 200 μm to about 2.5 mm, or about 500 μm to about 1 mm. The lengths of the grooves or trenches are not particularly limited, and may span the full or partial length or width of the sacrificial substrate, for example, about twice the width of the groove or trench to about 30%, 50%, 70%, or 90% of the length or width of the sacrificial substrate.

When the texturizing features include pores, the pores may have any suitable cross-sectional shape (e.g., circular, elliptical, triangular, rectangular, square, pentagonal, amorphous or irregular, etc.). The diameter and depth of each pore may independently be about 50 μm to about 10 mm, or about 100 μm to about 5 mm, or about 200 μm to about 2.5 mm, or about 500 μm to about 1 mm.

Figure 2B:
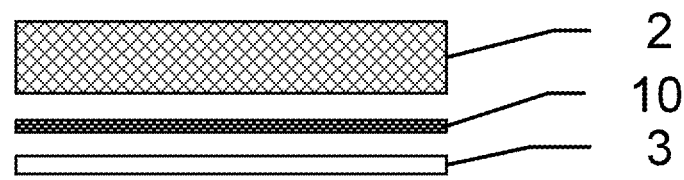
FIG. 2B is a schematic cross-sectional view of a sacrificial substrate attached to a build platform via an adhesive layer, according to embodiments of the present disclosure.

In some embodiments, the sacrificial substrate may be attached to the build platform using a layer of adhesive material. FIG. 2B is a schematic cross-sectional view of an example embodiment in which an adhesive layer 10 is positioned between the sacrificial substrate 3 and the build platform 2. A first side of the adhesive layer 10 is bonded to the build platform 2, while an opposite, parallel side of the adhesive layer 10 is bonded to the sacrificial substrate 3. The sacrificial substrate 3 may be formed separately from the stereolithography system using any suitable method, and does not need to be formed (e.g., polymerized) directly on the adhesive layer. Accordingly, the sacrificial substrate may include a material other than a photopolymerizable polymer as long as is different and separable from the polymer used to form the photopolymer part, as described herein.

The adhesive may be any adhesive substance that is able to stably attach the sacrificial substrate and cured photopolymer part to the build platform, and also has suitable reversibility so that the sacrificial substrate can be released from the build platform once deposition is complete. In some embodiments, the adhesive substance may be a pressure sensitive adhesive that is activated upon application of the adhesive layer against each surface with a suitable minimum pressure. The pressure may be applied on one surface at a time, or simultaneously on both surfaces. In some embodiments, the adhesive substance may be a heat sensitive (hot melt) adhesive that is applied between the build platform and the sacrificial substrate as a viscous liquid or semi-solid extrusion, forming a stable joint once solidified (e.g., recrystallized). In some embodiments, the adhesive substance may be a water soluble adhesive, wherein an adhesive polymer (such as those based on gluten, starch, casein, albumen, methyl cellulose, polyvinyl alcohol, carboxymethylcellulose, and polyvinylpyrrolidone) can be prepared as an aqueous solution for preparation, dried between surfaces to form a bond, and redissolved in water for removal. When the adhesive substance is a water soluble adhesive, the adhesive may be provided as a glue (suspension), a tape, a spray, etc. In some embodiments, the adhesive may be an acrylic adhesive, a butyl rubber, a silicone rubber, or an epoxy adhesive, etc., that is applied between the build platform and the sacrificial substrate as a viscous liquid and undergoes polymerization to thereby form a stable joint once solidified.

The adhesive may be applied in any suitable amount and/or pattern that enables secure attachment of the sacrificial substrate to the build platform. In some embodiments, for example, the adhesive may be applied to the entire interface between the sacrificial substrate and the build platform. In some embodiments, the adhesive may be applied only to the perimeter of the interface, in parallel strips or lines across the interface, or in a random pattern. In some embodiments, the adhesive may be applied to about 50% to about 60%, about 60% to about 70%, about 70% to about 80%, about 80% to about 90%, or about 90% to about 100% of the surface area of the interface.

Figure 2C:
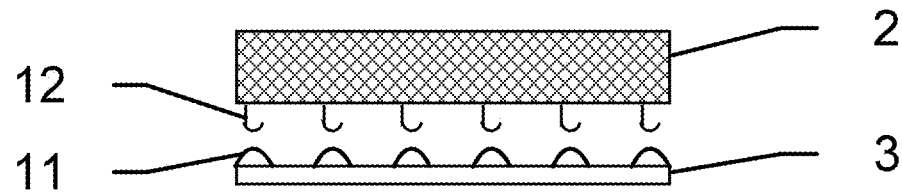
FIG. 2C is a schematic cross-sectional view of a sacrificial substrate attached to a build platform via a hook and loop attachment, according to embodiments of the present disclosure.

In some embodiments, the sacrificial substrate may be attached to the build platform using a hook and loop mechanism. FIG. 2C is a schematic cross-sectional view of an example embodiment in which the sacrificial substrate 3 includes multiple loops 11 on the surface facing the build platform 2, which includes multiple hooks 12 on the surface facing the sacrificial substrate 3. The hooks may be inserted into the loops to thereby bond the sacrificial substrate to the build platform. In some embodiments, the hooks may be deposited on the sacrificial substrate while the loops are deposited on the build platform, or both surfaces may contain a mixture of hooks and loops.

The density and sizes of the hooks and loops are not particularly limited as long as they are able to securely join the surfaces. For example, the hooks and loops may be about 1 mm to about 5 mm tall, and the hooks and loops may each have a density of about 100 to about 900 hooks/loops per square inch, or about 300 to about 600 hooks/loops per square inch. Non-limiting examples of material used to form the hooks and loops may include synthetic fibers such as polyester, nylon, polytetrafluoroethylene, vinyl, polypropylene, etc.

The hooks and loops may be formed on strips made of plastic, fabric, etc., that are attached to the surfaces using any suitable adhesive, such as those described herein. In some embodiments, a commercially available hook and loop attachment may be used, such as Velcro®, Duragrip®, 3M™ Hook and Loop fasteners, etc. The hook and loop attachment may be applied in any suitable amount and/or pattern that enables secure attachment of the sacrificial substrate to the build platform. In some embodiments, for example, the hook and loop attachment may be applied to the entire interface between the sacrificial substrate and the build platform. In some embodiments, the adhesive may be applied only to the perimeter of the interface, or in parallel strips or lines across the interface. In some embodiments, the hook and loop attachment may be applied to about 50% to about 60%, about 60% to about 70%, about 70% to about 80%, about 80% to about 90%, or about 90% to about 100% of the surface area of the interface.

Figure 2D:
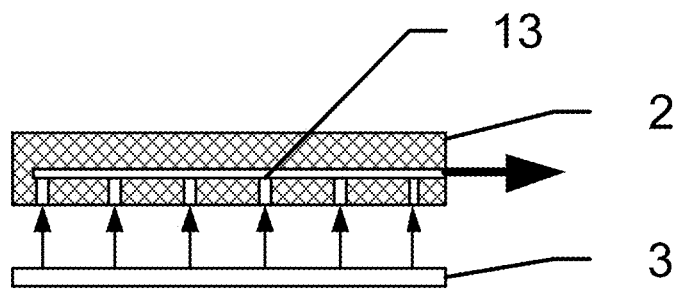
FIG. 2D is a schematic cross-sectional view of a sacrificial substrate attached to a build platform including multiple inlets and capable of acting as a vacuum chuck, according to embodiments of the present disclosure.

In some embodiments, the sacrificial substrate may be attached to the build platform using a differential pressure, such as a negative pressure applied using a vacuum chuck. FIG. 2D is a schematic cross-sectional view of an example embodiment in which the sacrificial substrate 3 is placed against the build platform 2, where the build platform includes multiple inlets 13 that are mutually connected to a device capable of producing a vacuum. When the vacuum is engaged, the sacrificial substrate 3 is securely pressed against the build platform 2 by the force of greater atmospheric pressure against the opposite surface of the sacrificial substrate 3.

In some embodiments, for example when one or both of the build platform and the sacrificial substrate are formed of a stiff, poorly compressible material or are not completely flat, a gasket may be placed between the build platform and the sacrificial substrate in order to enhance sealing between the two, and to prevent or reduce ingress of air that would reduce the applied vacuum. The shape of the gasket is not particularly limited as long as it forms an efficient seal. In some embodiments, the gasket may have a shape corresponding to a border of the interface, such that the multiple inlets of the build platform are enclosed within its inner area. In some embodiments, the gasket may have a shape corresponding to the full area of the interface, but may include holes corresponding to the inlets of the build platform in order to enable the vacuum to penetrate the interface between the gasket and the sacrificial substrate.

The gasket may be formed of any suitable material that is air-tight, slightly compressible, and capable of forming a seal. Non-limiting examples of such material include rubber, silicon rubber, butyl rubber, nitrile rubber, neoprene, polytetrafluoroethylene (PTFE), polychlorotrifluoroethylene (PCTFE), Viton®, polyurethane, styrene-butadiene rubber, and mixtures thereof.

The thickness of the gasket is not particularly limited. In some embodiments, for example, the gasket may have a final compressed thickness of about 1 mm to about 10 mm, or about 1 mm to about 5 mm, or about 1.5 mm to about 3 mm.

The shapes of the inlets in the build platform are not particularly limited, and may be, for example, circular, elliptical, rectangular, etc. The average size (e.g., diameter or cross-sectional area) of the inlets in the build platform is also not particularly limited as long as a degree of vacuum sufficient to secure the sacrificial substrate against the build platform can be applied to the sacrificial substrate. Further, the arrangement or layout of the inlets is not particularly limited. In some embodiments, for example, the inlets may be arranged in a regular square or hexagonally packed grid, or grouped in columns or rows.

The level of vacuum applied to the sacrificial substrate may be any suitable level of vacuum that enables secure attachment to the build platform. In some embodiments, for example, the vacuum (pressure) may be between absolute vacuum and ambient pressure, such as atmospheric pressure (e.g., 760 torr) For example, the pressure may be about 0 torr to about 200 torr, less than about 200 torr, less than about 400 torr, or less than about 600 torr.

Figure 2E:
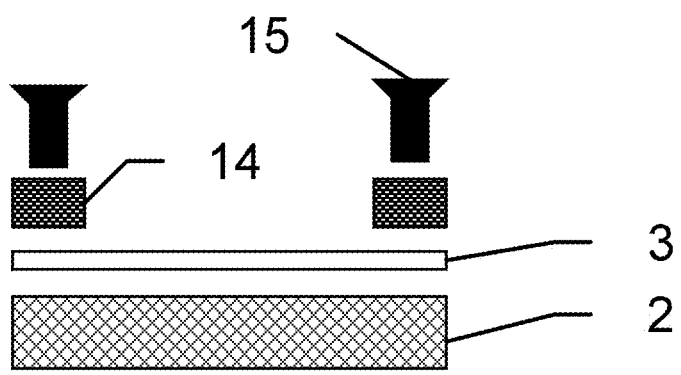
FIG. 2E is a schematic cross-sectional view of a sacrificial substrate attached to a build platform via a frame held in place with mechanical fasteners, according to embodiments of the present disclosure.

In some embodiments, the sacrificial substrate may be attached to the build platform using a reversible mechanical fastener. For example, the sacrificial substrate may be attached to the build platform using a screw, a pin, a bolt, or a combination thereof. FIG. 2E is a schematic cross-sectional view of an example embodiment in which the sacrificial substrate 3 is positioned between the build platform 2 and a frame 14 covering the periphery of the sacrificial substrate. One or more mechanical fasteners 15 are then passed through holes in the frame 14, sacrificial substrate 3, and build platform 2. Each of the mechanical fasteners 15 may include a head and a body, the head having a large diameter than the body, such that the body of the mechanical fastener may pass through the above-described holes, while the head of the mechanical fastener does not pass through the holes and thereby exerts a force against the surface of the sacrificial substrate 3. The end of the mechanical fastener is then joined to a closure such as a bolt, a nut, a cap, etc., having a diameter larger than the holes, and tightened to thereby secure the sacrificial substrate 3 between the frame 14 and the build platform 2. In some embodiments, the closure may be integrated into the body of the build platform (e.g., as a screw hole, a snap fit, an interference fit, etc.).

Figure 2F:
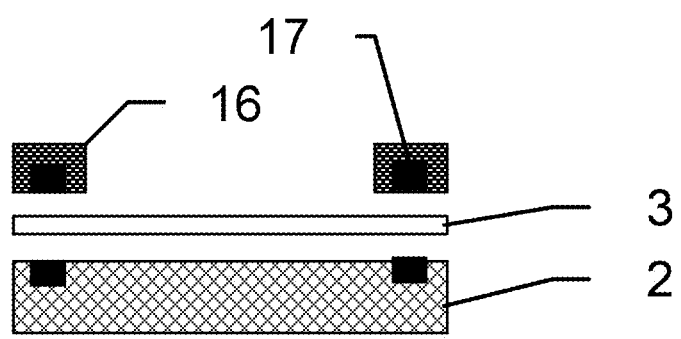
FIG. 2F is a schematic cross-sectional view of a sacrificial substrate attached to a build platform via a frame held in place with magnetic fasteners, according to embodiments of the present disclosure.

In some embodiments, the sacrificial substrate may be attached to the build platform using a magnetic force. FIG. 2F is a schematic cross-sectional view of an example embodiment in which the sacrificial substrate 3 is positioned between the build platform 2 and a frame 14 covering the periphery of the sacrificial substrate. Paired magnetic fasteners 16 and 17, integrated into the bodies of the frame 14 and the build platform 2, respectively, are vertically matched to thereby apply a magnetic force that immobilizes the sacrificial substrate 3 between them.

In some embodiments, the magnetic fasteners may include multiple paired magnets. In some embodiments, the magnetic fasteners may be a series of magnets paired with (attracted) to a rail, structure, series of pieces, etc. comprising a ferromagnetic material such as iron, nickel, cobalt, and mixtures or alloys thereof. In some embodiments, each magnet may independently be a permanent magnet or an electromagnet.

When the sacrificial substrate is held in place with a magnetic force, the magnetic fasteners may have any holding power suitable to maintain a secure attachment. In some embodiments, for example, the magnetic fasteners may have a holding power of about 0.5 lb. to about 1 lb. each, for a total holding power (magnetic attachment force) of at least 5 lbs., and in some embodiments about 5 lbs. to about 60 lbs.

The distribution and number of mechanical or magnetic fasteners are not particularly limited. In some embodiments, the mechanical or magnetic fasteners may be positioned at the periphery of the sacrificial substrate so that the photopolymer part may be deposited in the center of the sacrificial substrate, and the fasteners can be easily removed without touching or causing damage to the photopolymer part.

In some embodiments, the frame may be omitted, and the mechanical or magnetic fasteners may be positioned directly on the sacrificial substrate.

In some embodiments, when the stereolithography device is a top down device, the mechanical or magnetic fasteners and the frame may extend to any suitable height past the top of the sacrificial substrate. For example, the fasteners and frame may extend up to about 1 cm above the sacrificial substrate, or about 0.5 cm. However, when the stereolithography device is a bottom up device, the sacrificial substrate must be able to be approach the aperture at the bottom of the photopolymer reservoir at a distance at least as small as the thickness of a layer of the cured photopolymer part. Accordingly, when the fasteners and frame extend past the top of the sacrificial substrate, the attachment method may not be suitable for a bottom up device.

In some embodiments, the fasteners and/or frame may be inset within the sacrificial substrate and build platform. For example, the sacrificial substrate may include a groove, partially drilled hole, etc. into which the fasteners and/or frame can be inserted so that they are flush with or do not extend past the surface of the sacrificial substrate. Accordingly, the sacrificial substrate may be suitably used with either a top down or a bottom up stereolithography device.

It will be understood that although several example embodiments of attachment devices and strategies for attaching a sacrificial substrate to a build platform are described herein, embodiments of the present disclosure are not limited to thereto. For example, the sacrificial substrate may be attached to the build platform via a press fit or interference fit, removable bands, clips, z-clips, clamps, etc. In some embodiments, the sacrificial substrate and the build platform may be attached using a mixture of strategies, including those described above.

In some embodiments, the second side of the sacrificial substrate may be parallel to the first side that is attached to a build platform (e.g., may be on opposite sides of the build platform). The second side of the sacrificial substrate may be attached to the photopolymer part (e.g., the photopolymer part may be directly deposited on the second side of the sacrificial substrate).

Figure 3:
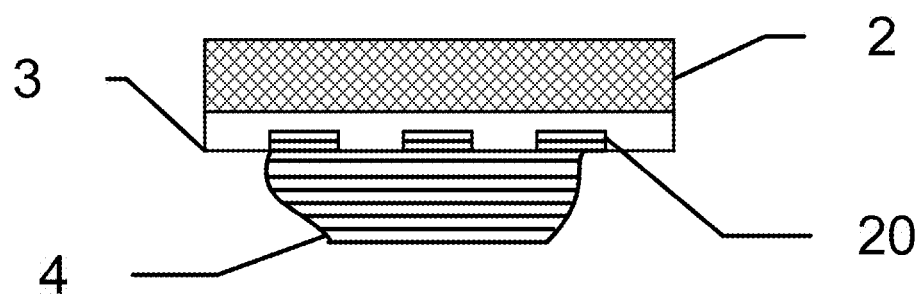
FIG. 3 is a schematic cross-sectional view of a sacrificial substrate attached to a build platform on one surface and attached to a photopolymer part on the opposite surface, where the interface between the sacrificial substrate and the photopolymer part includes interlocking structures to increase adhesion at that interface, according to embodiments of the present disclosure.

In some embodiments, the second side of the sacrificial substrate may be texturized to increase a surface area of the interface between the sacrificial substrate and the photopolymer part. FIG. 3 is a schematic cross-sectional view of an example embodiment in which a first side of the sacrificial substrate 3 is attached to the build platform 2, and the opposing second side of the sacrificial substrate 3 includes one or more interlocking structures or texturizing features 20. When the photopolymer part 4 is formed on the sacrificial substrate 3, portions of the photopolymer part 4 may be formed to complement the interlocking and/or texturizing features 20. The interlocking and/or texturizing features may be the same or similar to those described herein in connection with the interface between the sacrificial substrate and the build platform.

In some embodiments, the second side of the sacrificial substrate may be pre-treated prior to deposition of the photopolymer part. For example, the second side of the sacrificial substrate may be texturized, sanded, etched, oxidized, and/or treated with an adhesion promoter.

In some embodiments, the second side of the sacrificial substrate may be etched or sanded in order to increase mechanical adhesion to the photopolymer part (e.g., increase the surface energy of the sacrificial substrate), for example, by increasing the microscale surface area and hence the number of possible chemical bonding interactions between the sacrificial substrate and the photopolymer part. Any suitable etching or sanding method may be used, for example, scruff sanding, sand blasting, acid etching, base etching, solvent etching, etc., and those of ordinary skill in the art should be capable of selecting suitable sand grits, sanding times, etching solutions, and/or etching times according to their compatibility with the sacrificial substrate and the desired effect on adhesion to the cured photopolymer part.

In some embodiments, the second side of the sacrificial substrate may be treated with an oxidizing agent or process in order to increase mechanical adhesion to the photopolymer part (e.g., increase the surface energy of the sacrificial substrate), for example, by forming polar functional groups that can participate in bonding interactions with functional groups on the surface of the photopolymer part. In some embodiments, the sacrificial substrate may be treated with bleach, corona/ozone exposure, flame exposure, or a combination thereof. It will be understood that those of ordinary skill in the art are capable of selecting suitable oxidizing agents and exposure times according to their compatibility with the sacrificial substrate and the desired effect on adhesion to the cured photopolymer part.

According to embodiments of the present disclosure, a stereolithography device includes a reservoir, a build platform positioned above an open top of the reservoir or within the reservoir and configured to move vertically with respect to the reservoir, a light source, and a sacrificial substrate attached to the build platform and positioned between the build platform and the light source. The stereolithography device may be classified as a top-down or a bottom-up device, as described herein in connection with FIGS. 1A and 1B. In some embodiments, when the stereolithography device is a top-down device, the light source may be positioned above the open top of the reservoir. In some embodiments, when the stereolithography device is a bottom-up device, the stereolithography device may further include an aperture capable of transmitting radiation produced by the light source, the aperture being integrated with the bottom of the reservoir and spanning the thickness of the reservoir floor. The light source may be positioned below the aperture. When the stereolithography device is in use, a photopolymer resin may be held inside the reservoir.

The build platform, reservoir, and aperture are not particularly limited, and may be similar to commercially available elements in terms of suitable materials and sizes. The build platform is mobile (e.g., configured to be moved or translated during operation of the stereolithography device).

The sacrificial substrate attached to the build platform may be the same as described herein.

The photopolymer resin may be any suitable photopolymer resin for forming a sacrificial substrate or a photopolymer part, as described herein.

The light source may be any light source capable of generating light of a suitable wavelength for initiating photopolymerization of the photopolymer resin. For example, the light source may take the form of a digital projector, a lamp, a diode, a LED, a laser, etc. In some embodiments, the light may be ultraviolet (UV) light, e.g., light having a wavelength of about 200 nm to about 460 nm. The light may be in any suitable form, and for example, may be collimated (coherent) or non-coherent. However, embodiments of the present disclosure are not limited thereto, and those of ordinary skill in the art should be capable of selecting a suitable light source, wavelength, and form based on the principles described herein.

In some embodiments, when the stereolithography device is a bottom-up device, the stereolithography device may further include a compliant release layer on the aperture (e.g., between the sacrificial substrate or photopolymer part and the aperture) in order to encourage smooth release of the cured photopolymer part from the aperture after deposition of each layer. The compliant release layer is not particularly limited, and those of ordinary skill in the art are capable of selecting and installing the complaint release layer, as well as other stereolithography parts according to the stereolithography device and manufacturing needs.

According to embodiments of the present disclosure, a method of additively manufacturing a photopolymer part using a stereolithography device includes: attaching a sacrificial substrate to a build platform, the sacrificial substrate having a first surface facing the build platform and a second surface opposite the first surface, forming the photopolymer part on the second surface of the sacrificial substrate, separating the sacrificial substrate from the build platform, and removing the sacrificial substrate from the photopolymer part. In some embodiments, the method may further include pre-treating the second surface of the sacrificial substrate prior to forming the photopolymer part on the second surface of the sacrificial substrate.

Figure 4:
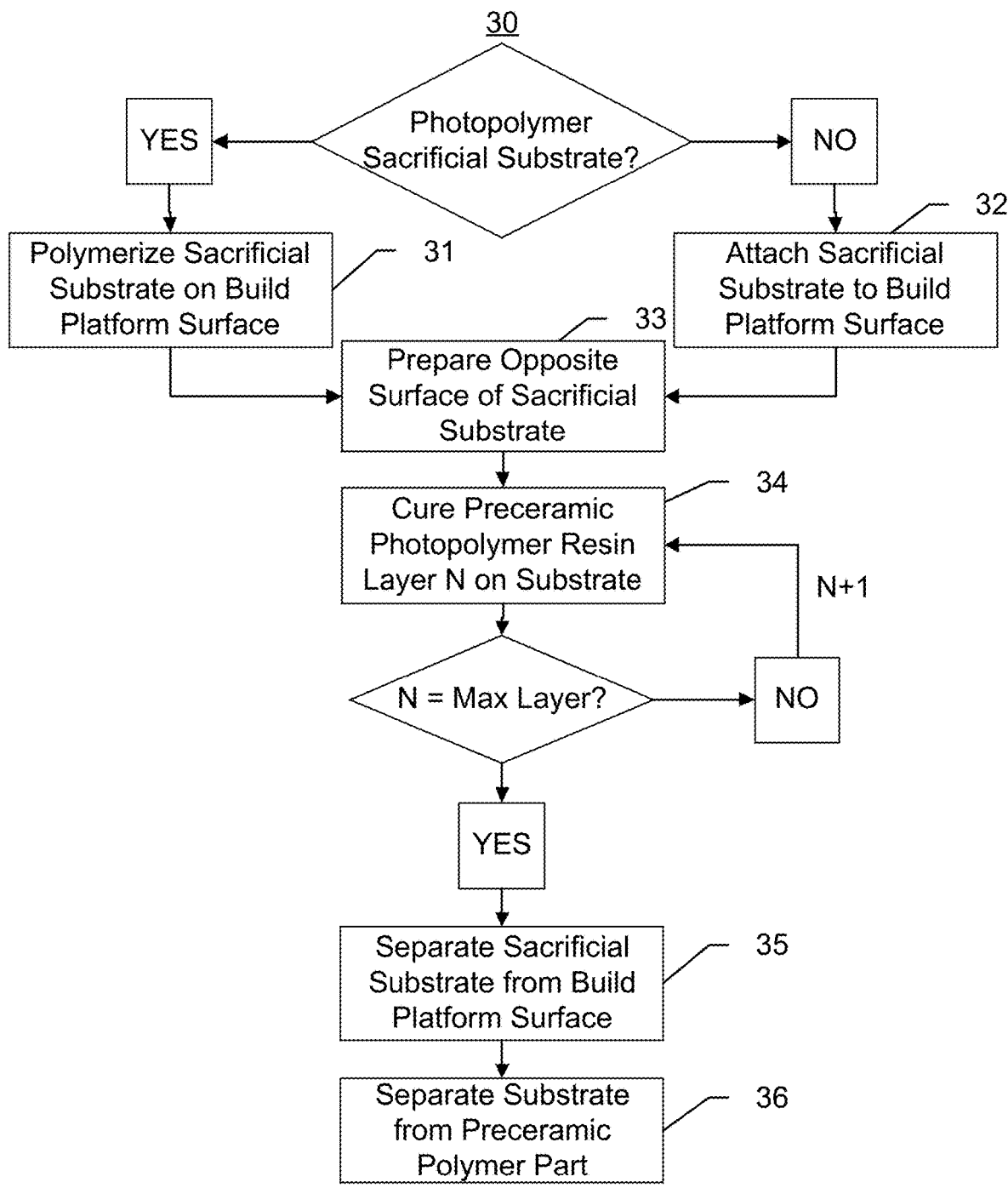
FIG. 4 is a flowchart illustrating a method of additively manufacturing a photopolymer part using a stereolithography device according to one or more embodiments of the present disclosure.

FIG. 4 is a flowchart illustrating a method of additively manufacturing a photopolymer part using a stereolithography device according to one or more embodiments of the present disclosure. Referring to FIG. 4, a method 30 of additively manufacturing a photopolymer part using a stereolithography device includes attaching a sacrificial substrate to a build platform. In the case that the sacrificial substrate is formed of a photopolymer resin, the sacrificial substrate is polymerized directly on to the build platform according to operation 31. The photopolymer resin may be the same as described herein with respect to the composition and material properties of the sacrificial substrate, and the parameters for depositing the photopolymer resin (e.g., deposition speed, exposure time, delay between layers, etc.) may be readily selected by those of ordinary skill in the art. Otherwise, the pre-formed sacrificial substrate is attached to the build platform according to operation 32. In this situation, the sacrificial substrate and method of attaching the sacrificial substrate may be the same as described herein with respect to non-photopolymerized embodiments of the sacrificial substrate. In either case, the first surface of the sacrificial substrate is directly adjacent to the build platform, leaving the opposite second surface free or open.

In some embodiments, when the sacrificial substrate is polymerized directly on the build platform from a photopolymer resin held within the photopolymer reservoir, the contents of the reservoir are changed out at the end of this process. For example, the photopolymer resin for forming the sacrificial substrate may be emptied from the photopolymer reservoir and replaced with fresh, separate photopolymer resin for forming the photopolymer part, or a new reservoir containing the new photopolymer resin may be installed in place of the old reservoir.

In operation 33, the second surface of the sacrificial substrate is pre-treated or prepared prior to deposition of the photopolymer part. In some embodiments, for example, the sacrificial substrate may be texturized, sanded, or etched, as described herein. In some embodiments, the second surface of the sacrificial substrate may be cleaned prior to deposition of the cured photopolymer part in order to remove contaminants and particles that may interfere with adhesion. For example, the sacrificial substrate may be cleaned or rinsed using any suitable bleach solution, organic solvent, surfactant solution, etc.

In operation 34, a layer of photopolymer resin for forming a photopolymer part is deposited on the sacrificial substrate. The operation is repeated, with subsequent layers being deposited or stacked on each last-formed layer, until a desired number of layers (e.g., maximum of N layers) is achieved, thereby forming the photopolymer part. The parameters for depositing the photopolymer resin (e.g., deposition speed, exposure time, delay between layers, etc.) may be readily selected by those of ordinary skill in the art.

When the photopolymer part is a preceramic part, the photopolymer resin may be a preceramic resin, as described herein. In some embodiments, the preceramic resin may be a polymer including silicon, carbon, nitrogen, boron, oxygen, or a combination thereof. For example, the preceramic resin may be a siloxane derivative, a siloxazane derivative, a carbosilane derivative, or a mixture thereof. In addition, the preceramic resin may include one or more functional groups that impart UV curability to the resin, as described herein. In some embodiments, the preceramic resin may be capable of being converted to SiC, SiCN, SiOC, SiOCN, SiCB, or a mixture thereof.

In operation 35, the sacrificial substrate is removed or separated from the build platform, yielding a composite structure including the sacrificial substrate and the photopolymer part. The sacrificial substrate may be separated from the build platform in such a way that a minimal amount of force is applied to the photopolymer part, thus avoiding damage to the photopolymer part. The method of separating the sacrificial substrate from the build platform may be selected according to the method previously used to join the two.

In some embodiments, for example, when the sacrificial substrate is directly photopolymerized onto the build platform, the sacrificial substrate may be mechanically separated from the build platform, for example, by scraping, peeling, cutting, or a combination thereof. When the sacrificial substrate is separated by cutting, the cut may be localized around the periphery of the cured photopolymer part, and the sacrificial substrate does not necessarily need to be separated in its entirety from the build platform.

In some embodiments, when the sacrificial substrate and build platform are joined via an adhesive, the sacrificial substrate may be separated by peeling or cutting, as described above. In some embodiments, the adhesive layer may be dissolved in a suitable solvent such as water, acetone, dichloromethane, chloroform, etc., or may be etched in an acidic or basic solution.

In some embodiments, when the sacrificial substrate and build platform are joined via a hook and loop attachment, the hooks and loops may be mechanically pulled or pushed apart. In some embodiments, when the sacrificial substrate and build platform are joined via a differential pressure, the pressure on both sides of the sacrificial substrate may be equalized (e.g., the vacuum may be decreased or turned off).

In some embodiments, when the sacrificial substrate and build platform are joined via reversible fasteners and/or a frame, the fasteners and/or frame may be physically removed. In some embodiments, when the sacrificial substrate and build platform are joined via a magnetic force, the magnets may be separated to thereby release the sacrificial substrate. For example, when the magnets are electromagnets, the power to the magnets may be turned off to thereby release the magnetic field.

In some embodiments, when the sacrificial substrate is capable of being dissolved or etched by a solvent or solution in which the photopolymer part is inert, the sacrificial substrate may be separated from the build platform via exposure to that solvent or solution. For example, when the sacrificial substrate is formed of polylactic acid and the cured photopolymer part is inert to base, the sacrificial substrate may be separated from the build platform via etching with NaOH.

In operation 36, the sacrificial substrate is separated from the photopolymer part. The separation may be accomplished via any suitable chemical process such as etching, melting, sublimation, pyrolysis, or oxidation.

In some embodiments, when the sacrificial substrate is separated from the build platform by etching as described above, the sacrificial substrate may be additionally removed from the photopolymer part by dissolution or etching of the sacrificial substrate in its entirety.

In some embodiments, removing the sacrificial substrate from the photopolymer part may be accomplished by heating the sacrificial substrate and photopolymer part so that the sacrificial substrate is melted and can be drained away from the photopolymer part, as described herein. In some embodiments, for example, the sacrificial substrate may be formed of a material having a low melting point, or a melting point lower than a reaction temperature of the photopolymer part. In some embodiments, when the photopolymer part is a preceramic material, the melting point of the sacrificial substrate may be lower than the ceramic transition temperature of the preceramic material.

In some embodiments, when the sacrificial substrate is formed of a material having a sublimation point lower than a reaction temperature of the cured photopolymer part, the sacrificial substrate may be sublimed and removed under vacuum, as described herein. In some embodiments, for example, the sacrificial substrate may be formed of a material having a low sublimation point, or a sublimation point lower than a reaction temperature of the cured photopolymer part. In some embodiments, when the cured photopolymer part is a preceramic material, the sublimation point of the sacrificial substrate may be lower than the ceramic transition temperature of the preceramic material.

When the sacrificial substrate is removed by melting or sublimation, the sacrificial substrate and photopolymer part may be heated to a temperature equal to or higher than the melting or sublimation point of the sacrificial substrate, but lower than the melting point or lowest reaction temperature of the photopolymer part. A larger difference in temperatures may enable finer control of this process. In some embodiments, the melting or sublimation point of the sacrificial substrate may be at least 100° C., at least 50° C., or at least 30° C. lower than the lowest reaction temperature of the photopolymer part. As used in this context, the term "lowest reaction temperature" refers to the lowest temperature at which a chemical reaction (e.g., pyrolysis or oxidation) is initiated. The duration or time of heating is not particularly limited, and may be any length of time necessary to remove the sacrificial substrate.

In some embodiments, removing the sacrificial substrate from the photopolymer part may be accomplished by heating the sacrificial substrate and photopolymer part so that the sacrificial substrate is decomposed via pyrolysis or oxidation while the photopolymer part remains intact, as described herein. For example, the sacrificial substrate may be converted to a gas, particles, or a mixture thereof. For example, the sacrificial substrate may be converted to CO, $CO_2$, acetaldehyde, ethylene, benzene, water vapor, carbon ash, soot, or a mixture thereof.

In some embodiments, the sacrificial substrate may be formed of a material having a decomposition temperature lower than the lowest reaction temperature of the cured photopolymer part. The difference in decomposition temperatures may be any difference that can be stably maintained by a furnace or heater used to carry out the separation. For example, the decomposition temperature of the sacrificial substrate may be at least 100° C., at least 50° C., or at least 30° C. lower than the lowest reaction temperature of the cured photopolymer part. The duration of heating is not particularly limited, and may be any length of time necessary to remove the sacrificial substrate. In some embodiments, the decomposition temperature of the sacrificial substrate may be equal to or lower than 325° C.

In some embodiments, when the photopolymer part is a preceramic part, the preceramic part may be converted into a ceramic part during the heating of the sacrificial substrate and photopolymer part, as described herein. For example, the silicon-containing polymer of the preceramic part may rearrange on a molecular scale to yield an amorphous crystal structure characteristic of a ceramic material. In some embodiments, when the preceramic polymer includes organic functional groups, the organic functional groups may be driven off as gaseous products under heating so that the inorganic backbone fraction of the part remains. In some embodiments, the preceramic part may be converted under an inert atmosphere (e.g., under pyrolysis conditions) in order to minimize or reduce loss of additional fractions of the preceramic to oxygen-containing decomposition products such as $CO_2$, $NO_2$, etc.

In some embodiments, the preceramic part may be converted into a ceramic part at the same time that the sacrificial substrate is removed (e.g., concurrently). In some embodiments, the sacrificial substrate may be removed before the preceramic part is converted into a ceramic part. For example, the sacrificial substrate may be removed during a first heating stage, and the preceramic part may be converted during a second heating stage. Alternatively, the preceramic part may be converted during the first heating stage and the sacrificial substrate may be removed during the second heating stage.

Figure 5:
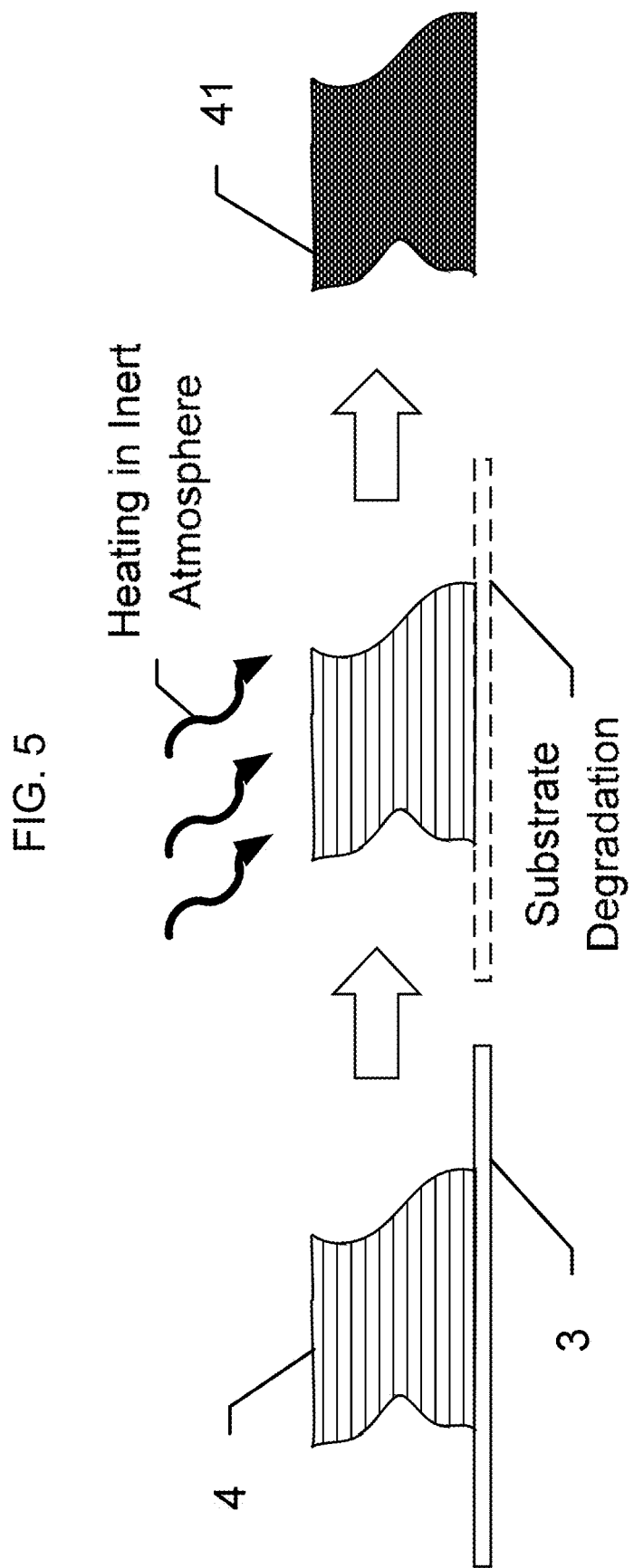
FIG. 5 is a schematic image illustrating the process of removing the sacrificial substrate from the cured photopolymer part via pyrolysis or oxidation at high temperatures, with concomitant conversion of a preceramic polymer part into a ceramic part, according to embodiments of the present disclosure.

FIG. 5 is a schematic image illustrating the process of removing a sacrificial substrate from a preceramic photopolymer part via pyrolysis or oxidation at high temperatures, with concomitant (e.g., simultaneous) conversion of the preceramic polymer part into a ceramic part. As a composite structure including a sacrificial substrate 3 and a photopolymer part 4 is heated above room temperature in an inert atmosphere, the sacrificial substrate 3 degrades and is removed from the composite as a gaseous or particulate product. The photopolymer part 4 is converted into a ceramic part 41.

The heating and decomposition may be carried out under any suitable atmosphere. For example, when heating is carried out under an inert atmosphere such as nitrogen, argon, helium, etc., the sacrificial substrate may be decomposed by pyrolysis. When the heating is carried out under an oxygen-containing atmosphere, the sacrificial substrate may be decomposed by oxidation. The amount of oxygen in the oxygen-containing atmosphere may be any suitable amount. For example, in some embodiments the oxygen-containing atmosphere may be pure (100%) oxygen. In some embodiments the oxygen-containing atmosphere may be ambient air having about 20% oxygen by volume. In some embodiments, the oxygen-containing atmosphere may have about 30%, about 40%, about 50%, about 60%, about 70%, about 80%, or about 90% oxygen by volume. When the oxygen-containing atmosphere is less than 100% oxygen, the remaining gas may have any suitable composition. For example, the remaining gas may comprise nitrogen, argon, helium, carbon dioxide, etc. at any suitable partial pressure. In some embodiments, the pyrolysis may be carried out under a full or partial vacuum.

In some embodiments, the heating and decomposition may be carried out under a combination of atmospheres. In some embodiments, for example, the heating and decomposition may be carried out in two stages, where a first heating stage is carried out under a first atmosphere and a second heating stage at an equal or higher temperature is carried out under a second atmosphere different from the first atmosphere. In some embodiments, different reactions may preferentially occur under specific atmospheres and temperatures. Accordingly, the atmospheres and temperatures of each stage may be coordinated so that specific reactions occur during the first and second stages.

The temperature ramp (e.g., rate of increase in temperature) during heating is not particularly limited. In some embodiments, for example, the temperature ramp may be about 5° C./min, or about 10° C./min. The temperature ramp may vary during the course of the reaction; for example, the temperature ramp may be faster during initial heating so as to quickly reach a minimum reaction temperature, and then may be slowed down so as to control the onset of subsequent reactions at higher temperatures. The temperature may be held (e.g., the temperature ramp may be paused and the temperature may be kept stable) at any suitable temperature to allow for one or more reactions to proceed to completion at a specific temperature. The final temperature may be any temperature sufficient for completion of all reactions (e.g., sacrificial substrate degradation and preceramic polymer conversion). For example, when the sacrificial substrate is formed of an organic material such as PLA, the final temperature may be about 1000° C.

The time of heating is not particularly limited, and may be any length of time sufficient for completion of all reactions (e.g., sacrificial substrate degradation and preceramic polymer conversion). In some embodiments, for example, the heating time may be about 4 hours, or about 8 hours, or about 12 hours, or about 24 hours.

The following examples are provided for illustrative purposes only, and do not limit the scope of the embodiments of the present invention.

Example 1. Pyrolysis of Sacrificial Substrate and Preceramic Part

A sacrificial substrate was directly deposited on a build platform using a stereolithography system. A photopolymer part was subsequently deposited on the sacrificial substrate using the same stereolithography system, and allowed to cure. The composite was then placed in a thermostat-controlled furnace under an atmosphere of nitrogen.

Figure 6:
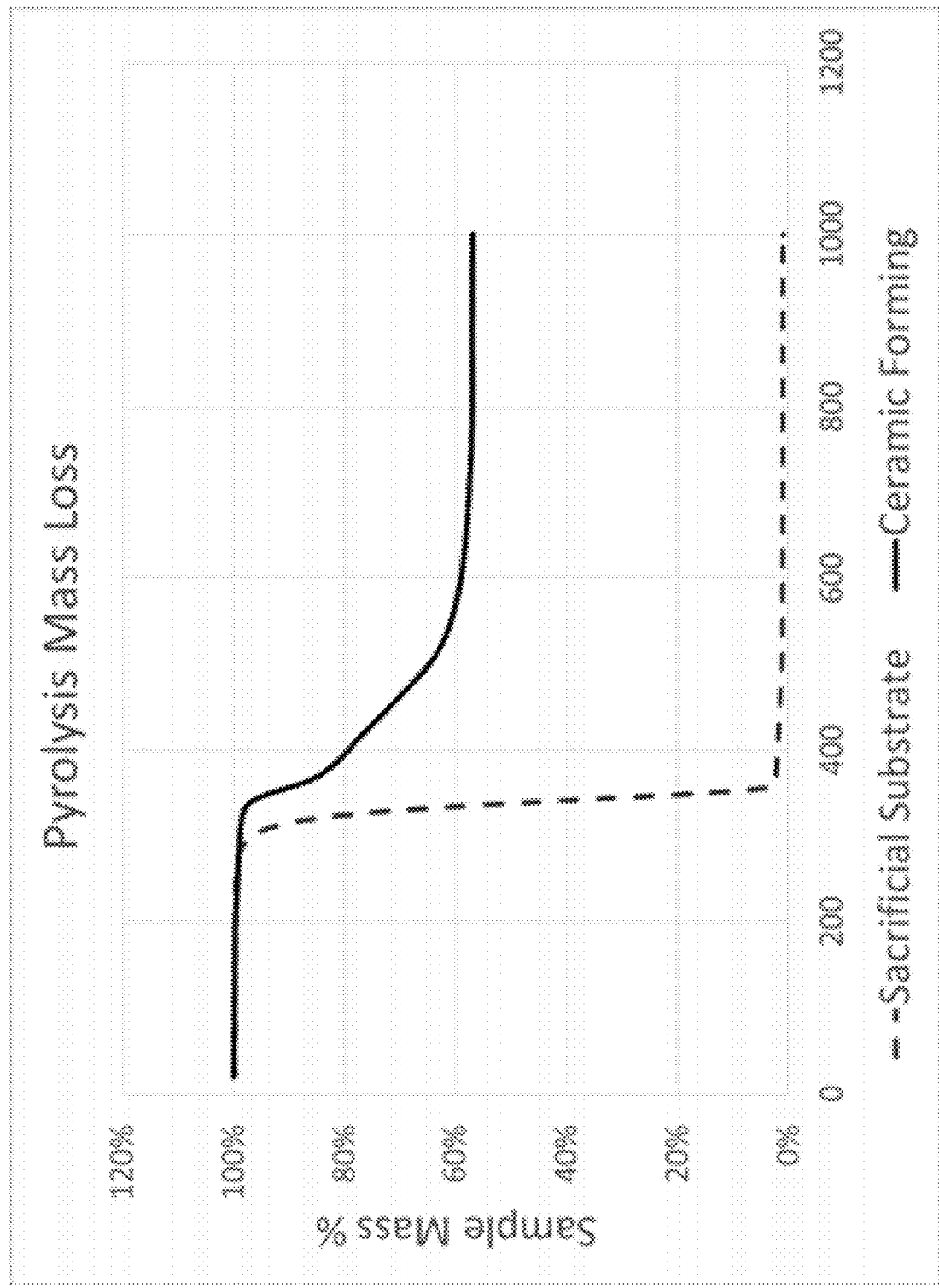
FIG. 6 is a graph showing the change in mass of the sacrificial substrate (dashed line) and the cured photopolymer part ("ceramic forming", solid line) under a nitrogen ($N_2$) atmosphere as the temperature is increased from 25° C. to 1000° C., according to embodiments of the present disclosure.

FIG. 6 is a graph showing the change in mass of the sacrificial substrate (dashed line) and the cured photopolymer part ("ceramic forming", solid line) as the temperature is increased from 25° C. to 1000° C. The decrease in sample mass % below 100% at 300° C. and 380° C. corresponds to the temperatures at which pyrolysis is initiated for the sacrificial substrate and the photopolymer part, respectively. The decrease in sample mass % to 0% for the sacrificial substrate signals that the sacrificial substrate is completely degraded during the temperature increase between 300° C. and 380° C. The decrease in sample mass % to about 58% for the photopolymer part signals that some of the preceramic material is degraded or lost to gaseous products during the temperature increase between 300° C. and 600° C., but the larger fraction remains and is stable up to a temperature of at least about 1000° C.

The sample mass loss of the sacrificial substrate appears to be substantially complete within the beginning stages of sample mass loss of the preceramic part, suggesting that the sacrificial substrate is degraded prior to conversion of the preceramic part (e.g., the sacrificial substrate is degraded in a first heating stage and the preceramic part is converted in a second heating stage).

Example 2. Oxidation of Sacrificial Substrate and Preceramic Part

A sacrificial substrate and photopolymer part were deposited according to substantially the same procedure used in Example 1. The composite was then placed in a thermostat-controlled furnace under an oxygen ($O_2$)-containing atmosphere.

Figure 7:
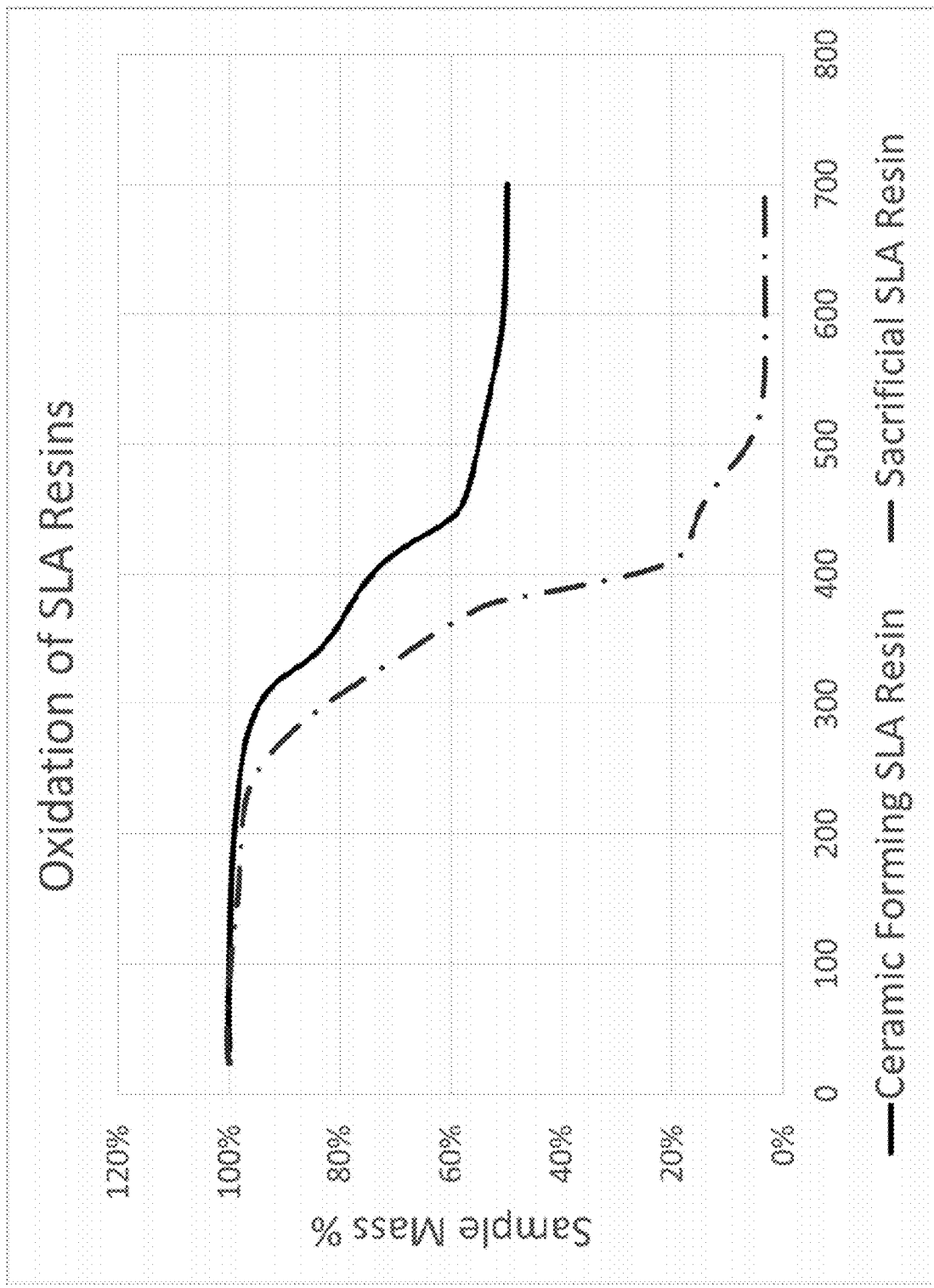
FIG. 7 is a graph showing the change in mass of the sacrificial substrate ("sacrificial SLA resin", dashed line) and the cured photopolymer part ("ceramic forming SLA resin", solid line) under an oxygen ($O_2$)-containing atmosphere as the temperature is increased from 25° C. to 700° C., according to embodiments of the present disclosure.

FIG. 7 is a graph showing the change in mass of the sacrificial substrate ("sacrificial SLA resin", dashed line) and the cured photopolymer part ("ceramic forming SLA resin", solid line) as the temperature is increased from 25° C. to 700° C. The decrease in sample mass % below 100% at 200° C. and 250° C. corresponds to the temperatures at which pyrolysis is initiated for the sacrificial substrate and the photopolymer part, respectively. The decrease in sample mass % to 0% for the sacrificial substrate signals that the sacrificial substrate is completely degraded during the temperature increase between 200° C. and 530° C. The decrease in sample mass % to about 50% for the photopolymer part signals that some of the preceramic material is degraded or lost to gaseous products during the temperature increase between 250° C. and 550° C., but the larger fraction remains and is stable up to a temperature of at least about 700° C.

The sample mass loss of the sacrificial substrate appears to be concurrent with sample mass loss of the preceramic part, suggesting that the sacrificial substrate is degraded simultaneously with conversion of the preceramic part.

The less steep roll off (decrease) in sample mass loss under oxidation conditions, compared to pyrolytic conditions, suggests that the substrate degradation and preceramic conversion reactions occur at lower rates in the presence of oxygen.

The differences in temperature onset and roll-off range (e.g., steep vs gradual decrease) for sample mass losses in the oxidized vs pyrolyzed examples demonstrate that the atmosphere can be varied to control the temperature onset and speed of substrate degradation and preceramic conversion.

Compared to pyrolysis of the composite in FIG. 6, the sample mass loss of the preceramic part upon conversion is slightly increased (e.g., 50% vs 58%), suggesting that more of the preceramic polymer is lost to gaseous side products, and that the structures and compositions of the ceramics produced under pyrolytic and oxidation conditions may differ.

In view of the foregoing, embodiments of the disclosure described herein may be applied to a variety of additive manufacturing methods and devices in order to reduce part count, scrap, non-recurring engineering, etc. In addition, embodiments of the present disclosure may be applied to additive manufacturing of components and parts used in high wear or high temperature applications that would necessitate ceramic materials, including propulsion structures (vanes, impellors, nacelles, thrusters), control surfaces (fins, leading edges), hypersonic structures (thermal protection systems, heat shields), high wear components (brakes, clutches, rotors), catalyst support structures, pump components, and filters. There is high commercial demand for additively manufactured ceramics in a variety of fields, including: automotive and aerospace, industrial filtration (molten metal filters, flow separators), metal processing (casting molds/blanks), implantable dental and medical devices, and semiconductor processing. Accordingly, embodiments of the present disclosure may be used in stereolithography systems to enable additive manufacturing in diverse industries and applications.

As used herein, unless otherwise expressly specified, all numbers such as those expressing values, ranges, amounts or percentages may be read as if prefaced by the word "about", even if the term does not expressly appear. As used herein, the terms "substantially", "about", and similar terms are used as terms of approximation and not as terms of degree, and are intended to account for the inherent deviations in measured or calculated values that would be recognized by those of ordinary skill in the art. Plural encompasses singular and vice versa. For example, while the present disclosure may describe "an" oligomer or "a" photopolymer, a mixture of such oligomers or photopolymers can be used. Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. As used herein, the terms "combination thereof" and "combinations thereof" may refer to a chemical combination (e.g., an alloy or chemical compound), a mixture, or a laminated structure of components.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath", "below", "lower", "under", "above", "upper", and the like, may be used herein for ease of explanation to describe one element or feature's relationship to another element(s) or feature(s) as illustrated in the accompanying drawings. It will be understood that the spatially relative terms are intended to encompass different orientations of the device in use or in operation, in addition to the orientations depicted in the accompanying drawings. For example, if the structures in the accompanying drawings are turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including", when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively.

While the subject matter of the present disclosure has been described in connection with certain embodiments, it is to be understood that the subject matter of the present disclosure is not limited to the disclosed embodiments, but, on the contrary, the present disclosure is intended to cover various modifications and equivalent arrangements included within the spirit and scope of the appended claims, and equivalents thereof.

What is claimed is:

1. A sacrificial substrate for utilization in stereolithography, the sacrificial substrate comprising a sacrificial substrate polymer, in which a first side of the sacrificial substrate is configured to be attached to a build platform, and a second side of the sacrificial substrate is configured to be attached to a preceramic photopolymer part,
    wherein the sacrificial substrate polymer has a melting, pyrolysis, sublimation, combustion, or decomposition temperature lower than the lowest reaction temperature of the preceramic photopolymer part.

2. The sacrificial substrate of claim 1, wherein the sacrificial substrate polymer comprises an acrylate, methacrylate, epoxy, thiol, or urethane photopolymer, or a mixture thereof; and
    the sacrificial substrate is formed directly on the build platform.

3. The sacrificial substrate of claim 2, wherein the build platform comprises a texturizing feature; and
    a portion of the sacrificial substrate polymer is formed inside the texturizing feature.

4. The sacrificial substrate of claim 2, wherein the sacrificial substrate polymer comprises a first functional group;
    the preceramic photopolymer part comprises a second functional group; and
    the first functional group and the second functional group form a bond.

5. The sacrificial substrate of claim 4, wherein the first functional group and the second functional group are acrylates.

6. The sacrificial substrate of claim 4, wherein the first functional group and the second functional group are thiols.

7. The sacrificial substrate of claim 1, wherein the sacrificial substrate polymer comprises polylactic acid (PLA), polyethylene terephthalate (PET), biaxially oriented polyethylene terephthalate (BOPET), cellulose, polypropylene, high density or low density polyethylene (HDPE, LDPE), acrylonitrile butadiene styrene (ABS), or a mixture thereof.

8. The sacrificial substrate of claim 1, wherein the sacrificial substrate comprises a texturizing feature on the second side of the sacrificial substrate to increase mechanical adhesion to the preceramic photopolymer part.

9. The sacrificial substrate of claim 1, wherein the first side of the sacrificial substrate is attached to the build platform by an adhesive.

10. The sacrificial substrate of claim 1, wherein the first side of the sacrificial substrate is attached to the build platform by a hook and loop attachment.

11. The sacrificial substrate of claim 1, wherein the first side of the sacrificial substrate is attached to the build platform by a reversible mechanical fastener.

12. The sacrificial substrate of claim 1, wherein the first side of the sacrificial substrate is attached to the build platform by a magnetic force.

13. The sacrificial substrate of claim 1, wherein the first side of the sacrificial substrate is attached to the build platform by a pressure differential.

14. A stereolithography device, the stereolithography device comprising:
    a reservoir for holding a photopolymer resin,
    a build platform configured to move vertically with respect to the reservoir,
    a light source, and
    the sacrificial substrate of claim 1 attached to the build platform and positioned between the build platform and the light source.

15. A method of additively manufacturing a ceramic photopolymer part, the method comprising:
    attaching the sacrificial substrate of claim 1 to a build platform;
    forming the preceramic photopolymer part on the sacrificial substrate;
    separating the sacrificial substrate from the build platform; and
    converting the preceramic photopolymer part into the ceramic photopolymer part and removing the sacrificial substrate from the ceramic photopolymer part.

16. The method of claim 15, wherein the attaching of the sacrificial substrate to the build platform comprises polymerizing a photopolymer resin directly on the build platform.

17. The method of claim 15, wherein the removing of the sacrificial substrate from the preceramic photopolymer part comprises heating the sacrificial substrate and photopolymer part to the melting, pyrolysis, sublimation, combustion, or decomposition temperature of the sacrificial substrate polymer.

18. The method of claim 17, wherein the heating of the sacrificial substrate and preceramic photopolymer part comprises heating to a temperature of about 200° C. to about 1000° C.

* * * * *